(12) United States Patent
Lee et al.

(10) Patent No.: US 9,935,083 B2
(45) Date of Patent: Apr. 3, 2018

(54) SEMICONDUCTOR PACKAGE AND MANUFACTURING METHOD THEREOF

(71) Applicant: Amkor Technology, Inc., Tempe, AZ (US)

(72) Inventors: Jae Ung Lee, Seoul (KR); Yung Woo Lee, Anyang-si (KR); Mi Kyeong Choi, Seoul (KR); Jin Seong Kim, Goyang-si (KR)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 15/149,144

(22) Filed: May 8, 2016

(65) Prior Publication Data
US 2017/0141081 A1 May 18, 2017

(30) Foreign Application Priority Data
Nov. 12, 2015 (KR) .......... 10-2015-0159058

(51) Int. Cl.
*H01L 23/552* (2006.01)
*H01L 25/065* (2006.01)
*H01L 25/00* (2006.01)

(52) U.S. Cl.
CPC .......... *H01L 25/0657* (2013.01); *H01L 25/50* (2013.01); *H01L 2224/16225* (2013.01); *H01L 2225/06513* (2013.01); *H01L 2225/06537* (2013.01); *H01L 2225/06558* (2013.01); *H01L 2225/06572* (2013.01); *H01L 2225/06586* (2013.01); *H01L 2924/15311* (2013.01); *H01L 2924/181* (2013.01)

(58) Field of Classification Search
CPC .................................................... H01L 23/552
See application file for complete search history.

(56) References Cited

U.S. PATENT DOCUMENTS

| 8,420,437 B1 * | 4/2013 | Fan ............... H01L 23/552 257/419 |
| 8,901,718 B2 | 12/2014 | Cho |
| 9,070,693 B2 | 6/2015 | Cho |
| 2013/0127025 A1 | 5/2013 | Cho |
| 2014/0299976 A1 | 10/2014 | Cho |

FOREIGN PATENT DOCUMENTS

| KR | 10-2015-0000173 | | 1/2013 |
| KR | 10-2013-0008666 | | 1/2015 |
| KR | 10201500001730 | * | 1/2015 |
| KR | 10-2015-0014568 | | 2/2015 |

OTHER PUBLICATIONS

Korean Patent Office, Notice of Allowance in Application No. 10-2015-0159068, dated Jan. 6, 2017 (5 pages).
Korean Office Action dated Aug. 1, 2017 for Korean Patent Application No. 10-2017-0024100.

* cited by examiner

*Primary Examiner* — Marvin Payen
(74) *Attorney, Agent, or Firm* — McAndrews, Held & Malloy, Ltd.

(57) ABSTRACT

A semiconductor package and a method of manufacturing a semiconductor package. As a non-limiting example, various aspects of this disclosure provide a semiconductor package, and method of manufacturing thereof, that comprises shielding on multiple sides thereof.

20 Claims, 9 Drawing Sheets

FIG. 8C

SEMICONDUCTOR PACKAGE AND MANUFACTURING METHOD THEREOF

CROSS-REFERENCE TO RELATED APPLICATIONS/INCORPORATION BY REFERENCE

The present application makes reference to, claims priority to, and claims the benefit of Korean Patent Application No. 10-2015-0159058 filed on Nov. 12, 2015, in the Korean Intellectual Property Office and titled "SEMICONDUCTOR PACKAGE AND METHOD FOR MANUFACTURING THE SAME," the contents of which are hereby incorporated herein by reference in their entirety.

BACKGROUND

Present semiconductor packages and methods for forming semiconductor packages are inadequate, for example resulting in excess cost, decreased reliability, inadequate shielding, package sizes that are too large, etc. Further limitations and disadvantages of conventional and traditional approaches will become apparent to one of skill in the art, through comparison of such approaches with the present disclosure as set forth in the remainder of the present application with reference to the drawings.

SUMMARY

Various aspects of this disclosure provide a semiconductor package and a method of manufacturing a semiconductor package. As a non-limiting example, various aspects of this disclosure provide a semiconductor package, and method of manufacturing thereof, that comprises shielding on multiple sides thereof.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

In the drawings, the thickness or size of layers, regions, and/or components may be exaggerated for clarity. Accordingly, the scope of this disclosure should not be limited by such thickness or size. Additionally, in the drawings, like reference numerals may refer to like elements throughout the discussion.

It will also be understood that when an element A is referred to as being "connected to" or "coupled to" an element B, the element A can be directly connected to the element B or indirectly connected to the element B (e.g., an intervening element C (and/or other elements) may be present between the element A and the element B).

Certain embodiments of the disclosure relate to a semiconductor package and a method for manufacturing the same.

Various electronic devices for exchanging signals as well as a plurality of semiconductor packages manufactured in various structures are integrated in various electronic systems, and thus electromagnetic interference (EMI) may be unavoidably generated while electrically operating the semiconductor packages and the electronic devices.

EMI may be generally defined as a synthetic radiation of an electric field and a magnetic field. The EMI may be generated by an electric field formed by the current flowing in a conducting material and a magnetic field.

If the EMI is generated from the semiconductor packages and the electronic devices densely packed on a motherboard, other neighboring semiconductor packages may be directly or indirectly affected by the EMI and may be damaged.

Various aspects of the present disclosure provide a semiconductor package and a method for manufacturing the same, which can prevent warpage by forming a molding on both surfaces of a substrate and can shield electromagnetic interference (EMI) by an EMI shielding layer formed to cover the molding and the substrate.

According to an aspect of the present disclosure, there is provided a semiconductor package including a substrate having a first surface and a second surface opposite to the first surface, at least one first electronic device formed on the first surface and electrically connected to the substrate, a first molding formed on the first surface to cover the first electronic device, a second molding formed to cover the second surface, a plurality of first conductive bumps formed on the second surface and electrically connected to the substrate and passing through the second molding, an electromagnetic interference (EMI) shielding layer formed to surround surfaces of the substrate, the first molding and the second molding to be spaced apart from the first conductive bumps, and a plurality of second conductive bumps formed on one surface of the second molding to be electrically connected to the plurality of first conductive bumps, respectively.

According to another aspect of the present disclosure, there is provided a method for manufacturing a semiconductor package including a substrate having a first surface and a second surface opposite to the first surface, at least one first electronic device formed on the first surface and electrically connected to the substrate, and a plurality of first conductive bumps formed on the second surface and electrically connected to the substrate, the method including forming a first molding on the first surface to cover the first electronic device and forming a second molding on the second surface to cover the first conductive bumps, grinding the second molding to expose the plurality of first conductive bumps to the outside, forming a plurality of second conductive bumps electrically connected to the exposed plurality of first conductive bumps, respectively, placing a jig under the second molding to surround the plurality of second conductive bumps, and forming an EMI shielding layer to cover surfaces of the substrate, the first molding and the second molding, which are exposed to the outside through the jig.

According to still another aspect of the present disclosure, there is provided a method for manufacturing a semiconductor package including a substrate having a first surface and a second surface opposite to the first surface, at least one first electronic device formed on the first surface and electrically connected to the substrate, and a plurality of first conductive bumps formed on the second surface and electrically connected to the substrate, the method including forming a first molding on the first surface to cover the first electronic device and forming a second molding on the second surface to cover the first conductive bumps, grinding the second molding to expose the plurality of first conductive bumps to the outside, forming an EMI shielding layer to entirely cover surfaces of the substrate, the first molding and the second molding, forming a plurality of exposing holes in the EMI shielding layer to expose the plurality of first conductive bumps to the outside, and forming a plurality of second conductive bumps electrically connected to the exposed plurality of first conductive bumps through the plurality of exposing holes, respectively.

As described above, in the semiconductor package and the method for manufacturing the same according to the present disclosure, warpage can be prevented by forming a molding on both surfaces of a substrate and electromagnetic interference (EMI) can be shielded by an EMI shielding layer formed to cover the molding and the substrate.

Further embodiments, features, and advantages of the present disclosure, as well as the structure and operation of the various embodiments of the present disclosure, are described in detail below with reference to the accompanying drawings.

Figure 1:
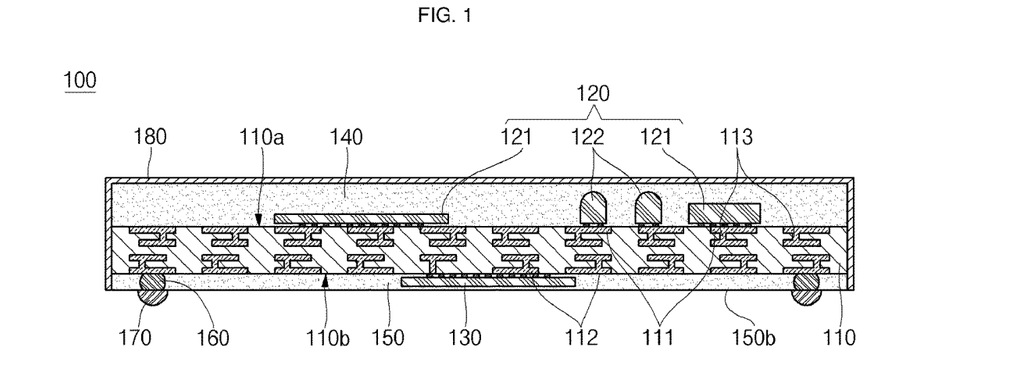
FIG. 1 is a cross-sectional view illustrating a semiconductor package according to an embodiment of the present disclosure.

Referring to FIG. 1, a cross-sectional view illustrating a semiconductor package according to an embodiment of the present disclosure is illustrated.

As illustrated in FIG. 1, the semiconductor package 100 includes a substrate 110, a first electronic device 120, a second electronic device 130, a first molding 140, a second molding 150, first conductive bumps 160, second conductive bumps 170 and an electric-magnetic interference (EMI) shielding layer 180.

The substrate 110 is shaped of a panel, which has a first surface 110a and a second surface 110b opposite to the first surface 110a. Here, the first surface 110a of the substrate 110 may be a top surface and the second surface 110b may be a bottom surface, and vice versa. The substrate 110 includes a plurality of first wire patterns 111 formed on the first surface 110a and a plurality of second wire patterns 112 formed on the second surface 110b. In addition, the substrate 110 may further include a plurality of conductive patterns 113 electrically connecting the first wire patterns 111 formed on the first surface 110a of the substrate 110 and the second wire patterns 112 formed on the second surface 110b. The conductive patterns 113 may be configured to penetrate between the first surface 110a and the second surface 110b of the substrate 110 or to partially penetrate to connect a plurality of wire patterns formed of multiple layers. That is to say, in a case where the substrate 110 is a single layer, the conductive patterns 113 may directly connect the first wire patterns 111 and the second wire patterns 112 or may connect the first wire patterns 111 and the second wire patterns 112 using additional wire patterns. That is to say, the first wire patterns 111, the second wire patterns 112 and the conductive patterns 113 of the substrate 110 may be implemented in various structures and types, but aspects of the present disclosure are not limited thereto.

The first electronic device(s) 120 is mounted on the first surface 110a of the substrate 110 to be electrically connected to the first wire patterns 111 of the substrate 110. The first electronic device(s) 120 may include semiconductor dies 121 and passive elements 122, which may be modified in various manners according to the type of the semiconductor package 100, but aspects of the present disclosure are not limited thereto. In the following description, the first electronic device 120(s) including two semiconductor dies 121 and two passive elements 122 will be described by way of example. In addition, the semiconductor dies 121 are formed in a flip chip type and may be mounted such that conductive bumps of the semiconductor dies 121 are welded to the first wire patterns 111 of the substrate 110. The semiconductor dies 121 may include bond pads and may be connected to the first wire patterns 111 by wire bonding. However, the present disclosure does not limit the connection relationship between the semiconductor dies 121 and the first wire patterns 111 to that disclosed herein.

The second electronic device(s) 130 is mounted on the second surface 110b of the substrate 110 to be electrically connected to the second wire patterns 112 formed on the substrate 110. The second electronic device 130(s) consisting of a single semiconductor die is illustrated. However, the second electronic device(s) 130 may consist of a plurality of semiconductor dies or may further include a passive element, but aspects of the present disclosure are not limited thereto.

The first molding 140 may be formed on the first surface 110a of the substrate 110 to cover the first electronic device(s) 120 mounted on the first surface 110a of the substrate 110. The first molding 140 may be made of a general molding compound resin, for example, an epoxy-based resin, but the scope of this disclosure is not limited thereto. The first molding 140 may protect the first electronic device 120 from external circumstances.

The second molding 150 may be formed on the second surface 110b of the substrate 110 to cover the second electronic device(s) 130 mounted on the second surface 110b of the substrate 110. The second molding 150 exposes the first conductive bumps 160 formed on the second surface 110b of the substrate 110 to the outside while completely covering the second electronic device(s) 130. The second molding 150 and the first conductive bumps 160 may have the same height. The second molding 150 and the first molding 140 may be made of the same material. The second molding 150 may protect the second electronic device 130 from external circumstances.

The first conductive bumps 160 may include a plurality of first conductive bumps formed on the second surface 110b of the substrate 110 to be electrically connected to the second wire patterns 112 formed on the substrate 110. The first conductive bumps 160 are configured such that side portions thereof are surrounded by the second molding 150 and portions of bottom surfaces thereof are exposed to the outside through the second molding 150. The exposed first conductive bumps 160 are electrically connected to the second conductive bumps 170. That is to say, the first conductive bumps 160 electrically connect the second conductive bumps 170 and the second wire patterns 112 formed on the substrate 110. The first conductive bumps 160 may include conductive pillars, copper pillars, conductive balls or copper balls, but aspects of the present disclosure are not limited thereto.

The second conductive bumps 170 may be formed on a bottom surface of the second molding 150 to be electrically connected to the first conductive bumps 160 exposed to the outside through the second molding 150. In a case where the semiconductor package 100 is mounted on an external device, such as a motherboard, the second conductive bumps 170 may be used in electrically connecting the semiconductor package 100 to the external device.

The EMI shielding layer 180 may be formed to a predetermined thickness enough to entirely cover the semiconductor package 100, except for the bottom surface of the second molding 150. That is to say, the EMI shielding layer 180 is formed to cover all of the top surface and four side surfaces of the semiconductor package 100. In addition, the EMI shielding layer 180 may be made of a conductive material and may be electrically connected to a ground of the semiconductor package 100 or an external ground. The EMI shielding layer 180 may shield EMI induced to (or generated by) the semiconductor package 100. In addition, the semiconductor package 100 may include the first and second moldings 140 and 150 to cover both of the first and second surfaces 110a and 110b of the substrate 110, thereby preventing warpage of the semiconductor package 100, which may occur when a molding is formed only on one surface of the substrate 110.

Figure 2:
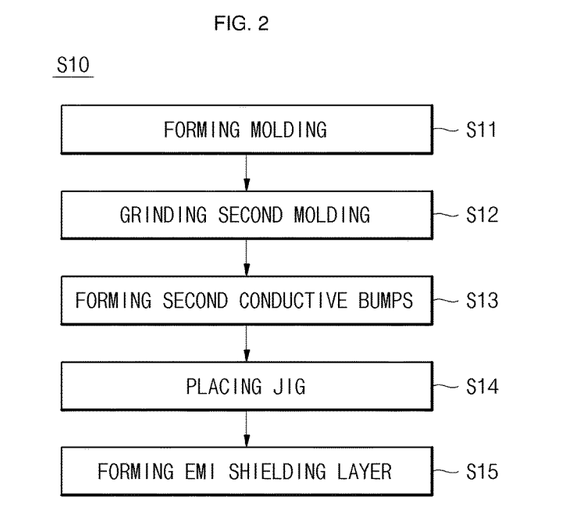
FIG. 2 is a flowchart illustrating a method for manufacturing the semiconductor package illustrated in FIG. 1.

Referring to FIG. 2, a flowchart illustrating a method for manufacturing the semiconductor package illustrated in FIG. 1 is illustrated. As illustrated in FIG. 2, the method for manufacturing the semiconductor package 100 (S10) includes forming a molding (S11), grinding a second molding (S12), forming second conductive bumps (S13), placing a jig (S14) and forming an EMI shielding layer (S15).

Referring to FIGS. 3A to 3E, cross-sectional views illustrating various steps of the method for manufacturing the semiconductor package illustrated in FIG. 2 are illustrated.

Figure 3A:
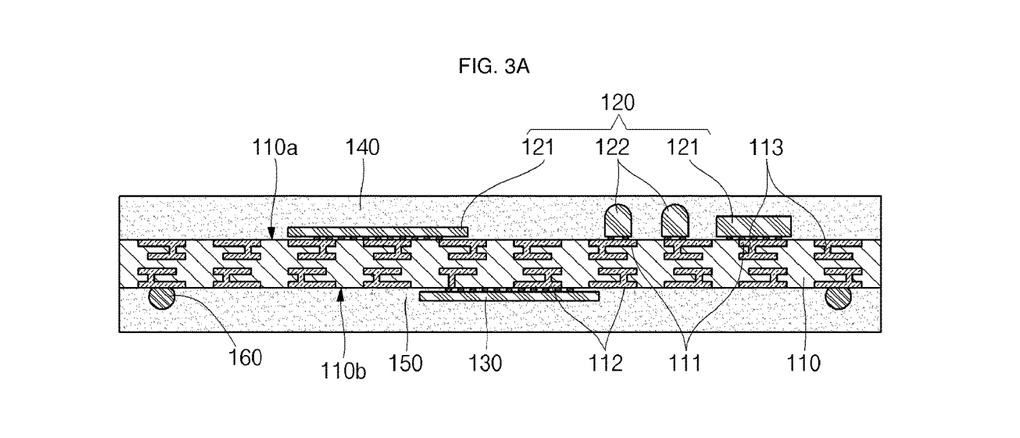
FIGS. 3A to 3E are cross-sectional views illustrating various steps of the method for manufacturing the semiconductor package illustrated in FIG. 2.

First, before the forming of the molding (S11), the first electronic device 120 is mounted on the first surface 110a of the substrate 110 to be electrically connected to the first wire patterns 111, the second electronic device 130 is mounted on the second surface 110b of the substrate 110 to be electrically connected to the second wire patterns 112, and the plurality of first conductive bumps 160 are then formed on the second surface 110b of the substrate 110 to be electrically connected to the second wire patterns 112.

As illustrated in FIG. 3A, in the forming of the molding (S11), the first molding 140 is formed to cover the first surface 110a of the substrate 110 and the first electronic device 120, and the second molding 150 is formed to cover the second surface 110b of the substrate 110, the second electronic device 130 and the plurality of first conductive bumps 160. The first molding 140 and the second molding 150 may be formed at the same time. For example, a mold is placed to surround the substrate 110 including the first electronic device 120, the second electronic device 130 and the first conductive bumps 160, and a molding resin is injected into a space in the mold, thereby forming the first molding 140 and the second molding 150 at the same time. Here, in a state in which the first electronic device 120, the second electronic device 130, the first conductive bumps 160 and the substrate 110 are spaced apart from the inner surface of the mold so as not to contact the inner surface of the mold, the molding resin is injected into the mold, thereby forming the first molding 140 and the second molding 150. That is to say, the first molding 140 is formed to entirely cover the first surface 110a of the substrate 110 and the first electronic device 120, and the second molding 150 is formed to entirely cover the second surface 110b of the substrate 110, the second electronic device 130 and the first conductive bumps 160.

Figure 3B:
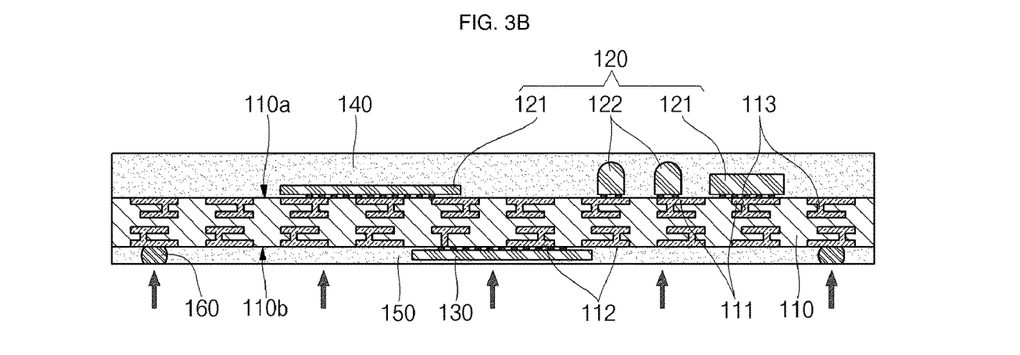

As illustrated in FIG. 3B, in the grinding of the second molding (S12), a bottom surface of the second molding 150 is grinded to expose the first conductive bumps 160 to the outside of the second molding 150. That is to say, in the grinding of the second molding (S12), the second molding 150 is grinded to expose the first conductive bumps 160 to the outside. At this time, bottom portions of the first conductive bumps 160 may also be partially grinded. Bottom surfaces of the first conductive bumps 160 and the bottom surface of the second molding 150 may be coplanar. In addition, the second electronic device 130 may be positioned within the second molding 150 and the second electronic device 130 may, for example, not be exposed to the outside. The grinding may be performed using, for example, a diamond grinder and an equivalent thereof, but aspects of the present disclosure are not limited thereto.

Figure 3C:
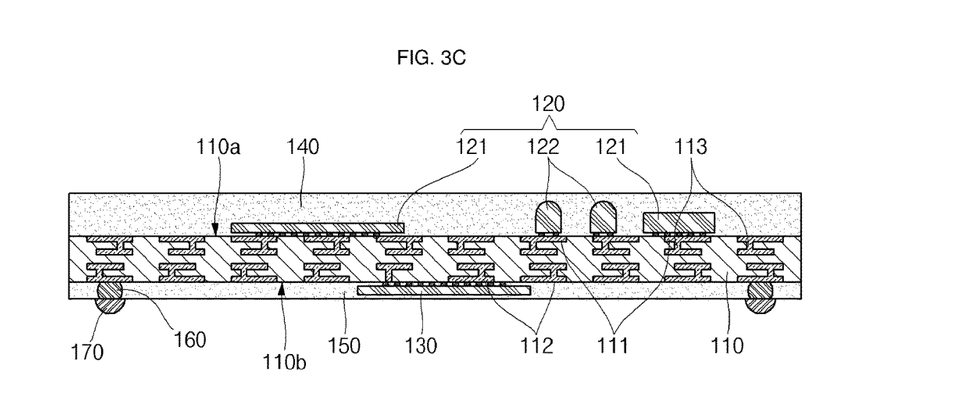

As illustrated in FIG. 3C, in the forming of the second conductive bumps (S13), the plurality of second conductive bumps 170 are formed to be electrically connected to the plurality of first conductive bumps 160 exposed to the outside in the grinding of the second molding (S12), respectively. The second conductive bumps 170 may be formed using one of ball dropping, screen printing, electroplating, vacuum evaporation, plating and equivalents thereof, but aspects of the present disclosure are not limited thereto. In addition, the second conductive bumps 170 may be made of a metallic material, such as lead/tin (Pb/Sn) or leadless Sn, and equivalents thereof, but aspects of the present disclosure are not limited thereto.

Figure 3D:
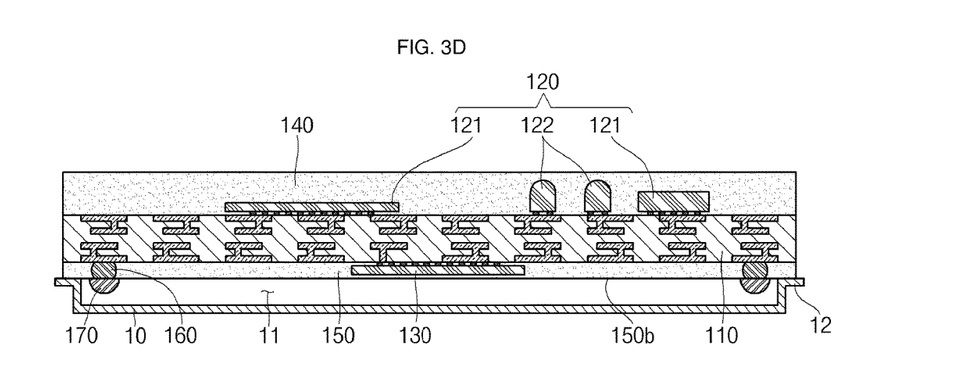

As illustrated in FIG. 3D, in the placing of the jig (S14), the jig 10 is loaded and placed to cover the bottom surface 150b of the second molding 150. The jig 10 is shaped of a substantially rectangular frame and may have an internal space 11 having a predetermined depth in a top-to-bottom direction and a planar part 12 outwardly extending a predetermined length along the outer circumference. The planar part 12 may be brought into contact with the outer circumference of the bottom surface 150b of the second molding 150 to then be fixed, the second conductive bumps 170 formed on the bottom surface 150b of the second molding 150 may be inserted into the internal space 11. That is to say, in the placing of the jig (S14), the jig 10 is placed to cover the bottom surface 150b of the second molding 150, and the first molding 140, the side surface of the substrate 110 and the side surface of the second molding 150 are exposed to the outside.

Figure 3E:
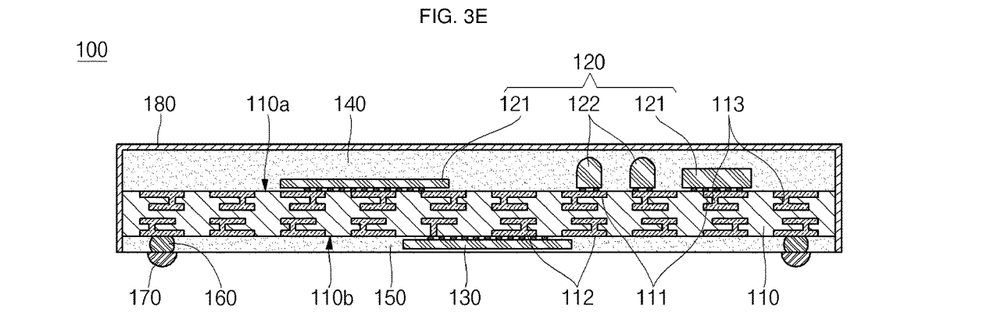

As illustrated in FIG. 3E, in the forming of the EMI shielding layer (S15), EMI shielding layer 180 is formed on the first molding 140, the side surface of the substrate 110 and the side surface of the second molding 150, which are exposed to the outside in the placing of the jig (S14). The EMI shielding layer 180 is formed to entirely cover all of the first molding 140, the side surface of the substrate 110 and the side surface of the second molding 150, except for the bottom surface 150b of the second molding 150 covered by the jig 10. That is to say, the EMI shielding layer 180 is formed to entirely cover four side surfaces and the top surface of the semiconductor package 100, except for the bottom surface of the semiconductor package 100. The EMI shielding layer 180 may be formed to a predetermined thickness by plasma deposition or spraying, but aspects of the present disclosure are not limited thereto. In addition, after the forming of the EMI shielding layer (S15), in order to remove metal residuals produced in the forming of the EMI shielding layer 180 made of a conductive material, cleaning may further be performed. In addition, after the EMI shielding layer 180 is formed and the cleaning is performed, the jig 10 positioned under the second molding 150 is separated to complete the semiconductor package 100 having the EMI shielding layer 180. In FIGS. 3A to 3E, a single semiconductor package 100 is manufactured, but a plurality of semiconductor packages may be formed on the substrate 110 to then be divided through a singulation process into a discrete semiconductor package 100.

Figure 4:
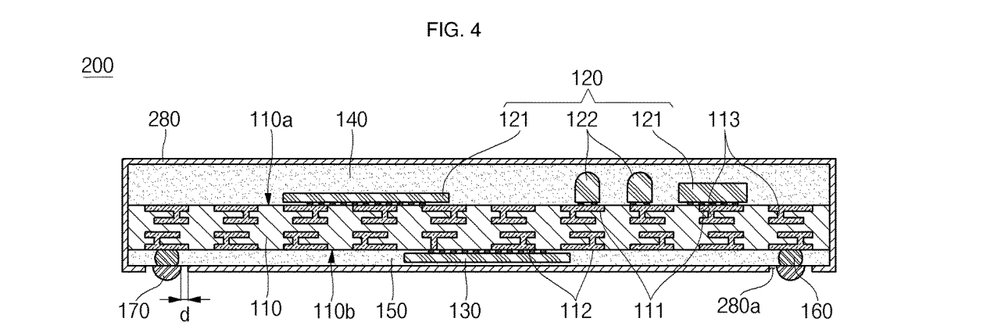
FIG. 4 is a cross-sectional view illustrating a semiconductor package according to another embodiment of the present disclosure.

Referring to FIG. 4, a cross-sectional view illustrating a semiconductor package according to another embodiment of the present disclosure is illustrated.

As illustrated in FIG. 4, the semiconductor package 200 includes a substrate 110, a first electronic device 120, a second electronic device 130, a first molding 140, a second molding 150, first conductive bumps 160, second conductive bumps 170 and an EMI shielding layer 280. The semiconductor package 200, including the substrate 110, the first electronic device 120, the second electronic device 130, the first molding 140, the second molding 150, the first conductive bumps 160 and the second conductive bumps 170, has the same configuration with the semiconductor package 100 illustrated in FIG. 1. Therefore, the following description of the semiconductor package 200 will focus on the EMI shielding layer 280, which is a different feature from the semiconductor package 100 illustrated in FIG. 1.

The EMI shielding layer 280 is formed to cover a top surface, four side surfaces and a bottom surface of the semiconductor package 200 to a predetermined thickness and may expose second conductive bumps 170 to the outside. That is to say, the EMI shielding layer 280 may be formed to entirely cover the semiconductor package 200, except for the second conductive bumps 170. In addition, the EMI shielding layer 280 may be made of a conductive material and may be electrically connected to a ground of the semiconductor package 200 or an external ground.

The EMI shielding layer 280 may include a plurality of exposing holes 280a. The second conductive bumps 170 may be exposed to the outside of the EMI shielding layer 280 through the exposing holes 280a. That is to say, the exposing holes 280a of the EMI shielding layer 280 may be located to correspond to the second conductive bumps 170.

In addition, the exposing holes 280a may have larger widths than diameters of the second conductive bumps 170. That is to say, the EMI shielding layer 280 may be spaced a predetermined distance (d) apart from the second conductive bumps 170 by the exposing holes 280a and may be electrically disconnected from the second conductive bumps 170 made of a conductive material. Here, portions surrounding the second conductive bumps 170 in the second molding 150 may be exposed to the outside of the exposing holes 280a of the EMI shielding layer 280.

The EMI shielding layer 280 is formed to cover all surfaces of the semiconductor package 200, except for the second conductive bumps 170 as external terminals, thereby shielding EMI induced from (or induced upon) the semiconductor package 200.

Figure 5A:
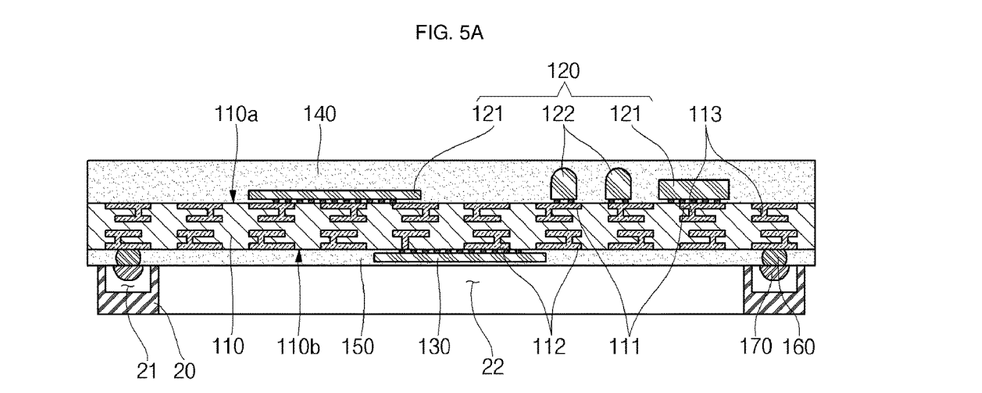
FIGS. 5A and 5B are cross-sectional views illustrating various steps in manufacturing the semiconductor package illustrated in FIG. 4 by the semiconductor package manufacturing method illustrated in FIG. 2.
Figure 5B:
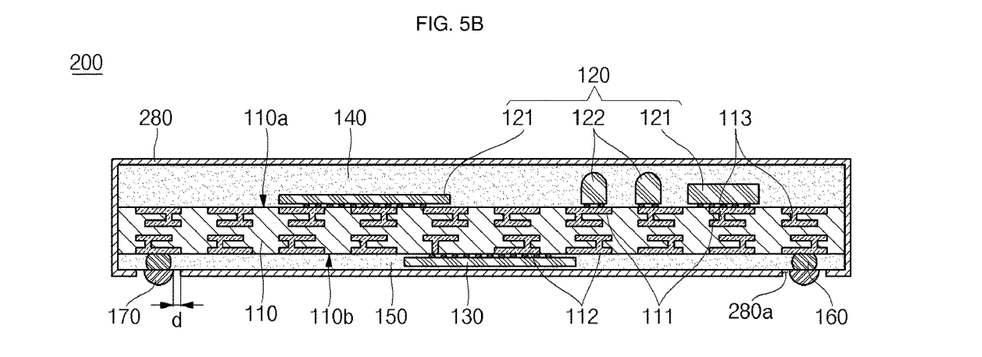

The semiconductor package 200 illustrated in FIG. 4 may be manufactured by the semiconductor package manufacturing method illustrated in FIG. 2. Referring to FIGS. 5A and 5B, cross-sectional views illustrating various steps in the method for manufacturing the semiconductor package illustrated in FIG. 4 by the semiconductor package manufacturing method illustrated in FIG. 2 are illustrated. Hereinafter, the method for manufacturing the semiconductor package 200 will be described with reference to FIGS. 2, 5A and 5B.

As illustrated in FIG. 2, the method for manufacturing the semiconductor package 200 (S10) includes forming a molding (S11), grinding a second molding (S12), forming second conductive bumps (S13), placing a jig (S14) and forming an EMI shielding layer (S15). Here, the forming of the molding (S11), the grinding of the second molding (S12) and the forming of the second conductive bumps (S13) are the same as the corresponding steps in the method for manufacturing the semiconductor package 100 illustrated in FIGS. 3A to 3C. Therefore, the following description of the method for manufacturing the semiconductor package 200 (S10) will focus on the placing of the jig (S14) and the forming of the EMI shielding layer (S15), which are different features from the method for manufacturing the semiconductor package 100 illustrated in FIGS. 3A to 3C, with reference to FIGS. 5A and 5B.

Figure 6:
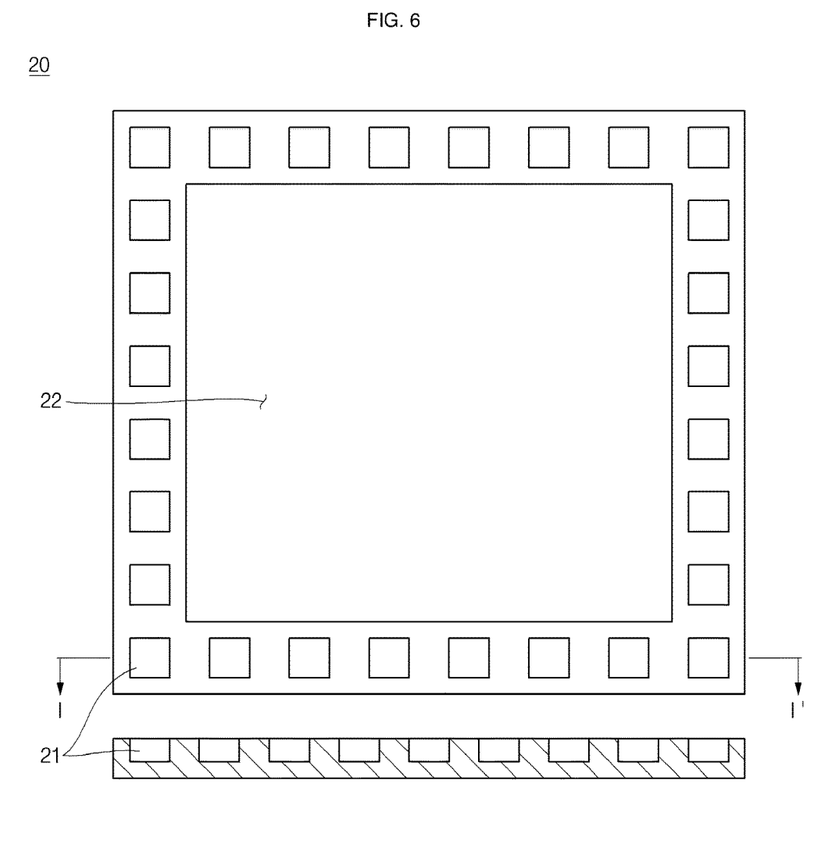
FIG. 6 illustrates a plan view and a cross-sectional view illustrating a structure of a jig illustrated in FIG. 5A.

As illustrated in FIG. 5A, in the placing of the jig (S14), the jig 20 is loaded and placed to cover a bottom portion of the second molding 150. As illustrated in FIG. 6, the jig 20 is shaped of a substantially rectangular frame and may have a plurality of grooves 21 having a depth in a top-to-bottom direction. The jig 20 may include the plurality of grooves 21 located to correspond to second conductive bumps 170 of the semiconductor package 200 and the second conductive bumps 170 may be inserted into the plurality of grooves 21, respectively. That is to say, the second conductive bumps 170 may be surrounded by the jig 20. Here, in order to allow the second conductive bumps 170 into the plurality of grooves 21 of the jig 20, the plurality of grooves 21 preferably have larger diameters than the second conductive bumps 170.

In addition, the jig 20 is shaped of a rectangular ring having its central portion opened by a centrally formed hole 22. That is to say, a central portion of the bottom surface 150b of the second molding 150, which is not adjacent to (or immediately adjacent to) the second conductive bumps 170, is exposed to the outside through the hole 22 of the jig 20. The EMI shielding layer 280 may also be formed on a bottom surface of the semiconductor package 200 through the hole 22 of the jig 20.

In the placing of the jig (S14), the jig 20 is placed under the second molding 150 to cover the second conductive bumps 170 and exposes a first molding 140, a substrate 110 and the second molding 150 to the outside.

As illustrated in FIG. 5B, in the forming of the EMI shielding layer (S15), the EMI shielding layer 280 is formed on the first molding 140, the substrate 110 and the second molding 150, which are exposed to the outside in the placing of the jig (S14). That is to say, in the forming of the EMI shielding layer (S15), the EMI shielding layer 280 is formed to cover a top surface, four side surfaces and a bottom surface of the semiconductor package 200, except for the second conductive bumps 170, using the jig 20 as a mask. The EMI shielding layer 280 may be formed to a predetermined thickness by plasma deposition or spraying, but aspects of the present disclosure are not limited thereto. In addition, after the forming of the EMI shielding layer (S15), in order to remove metal residuals produced in the forming of the EMI shielding layer 280 made of a conductive material, cleaning may further be performed. In addition, after the EMI shielding layer 280 is formed and the cleaning is performed, the jig 20 positioned under the second molding 150 is separated to complete the semiconductor package 200 having the EMI shielding layer 280. In addition, once the jig 20 is separated, since the EMI shielding layer 280 is not formed on the second conductive bumps 170 surrounded by the jig 20 and portions around the second conductive bumps 170, exposing holes 280a exposing the second conductive bumps 170 are provided in the EMI shielding layer 280. Then, the EMI shielding layer 280 may be electrically disconnected from the second conductive bumps 170 by the exposing holes 280a and may be spaced a predetermined distance (d) apart from the second conductive bumps 170.

Figure 7:
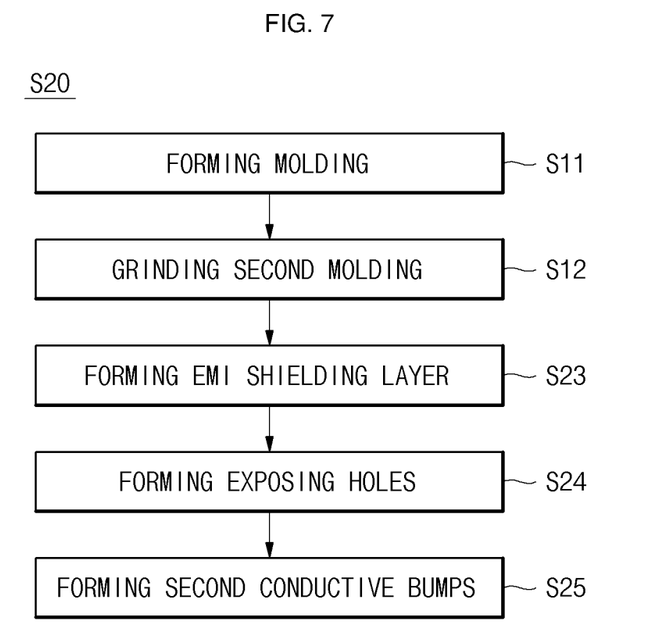
FIG. 7 is a flowchart illustrating a method for manufacturing the semiconductor package illustrated in FIG. 4 according to another embodiment of the present disclosure.

Referring to FIG. 7, a flowchart illustrating a method for manufacturing the semiconductor package illustrated in FIG. 4 according to another embodiment of the present disclosure is illustrated. As illustrated in FIG. 7, the method for manufacturing the semiconductor package 200 (S20) includes forming a molding (S11), grinding a second molding (S12), forming an EMI shielding layer (S23), forming exposing holes (S24) and forming second conductive bumps (S25). Here, the forming of the molding (S11) and the grinding of the second molding (S12) illustrated in FIG. 7 are the same as the corresponding steps in the method for manufacturing the semiconductor package 100 illustrated in FIGS. 2, 3A and 3B.

Figure 8A:
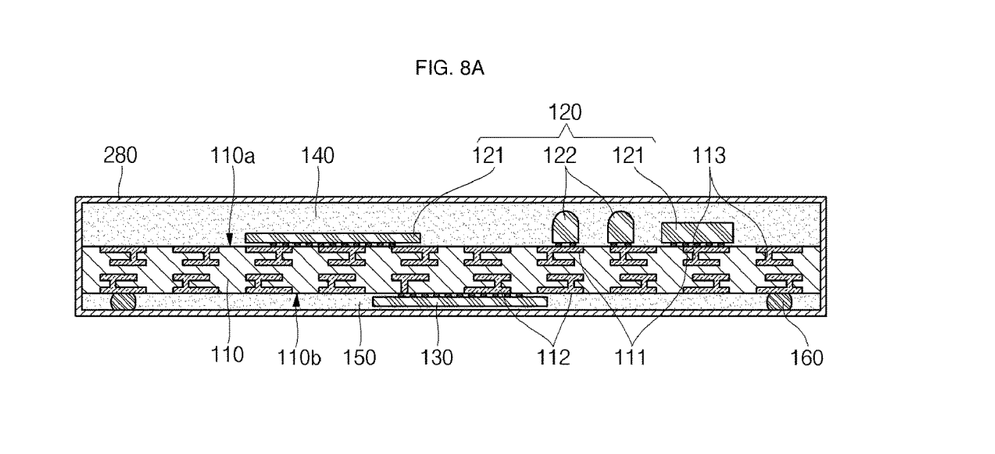
FIGS. 8A to 8C are cross-sectional views illustrating various steps of the method for manufacturing the semiconductor package illustrated in FIG. 7.
Figure 8B:
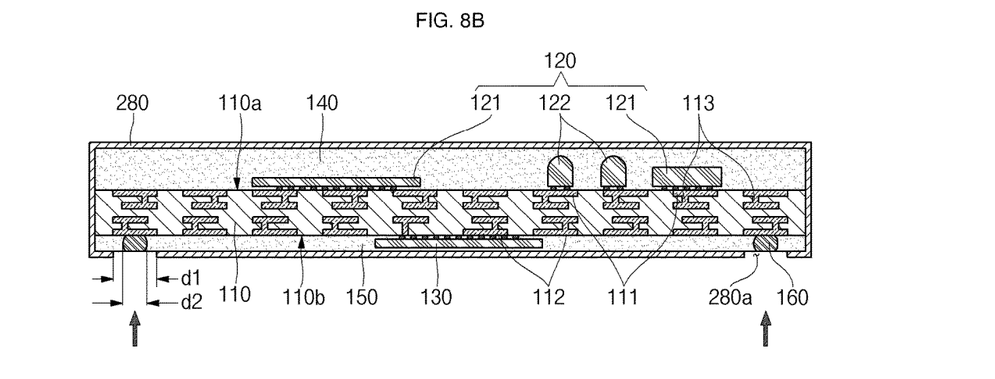
Figure 8C:
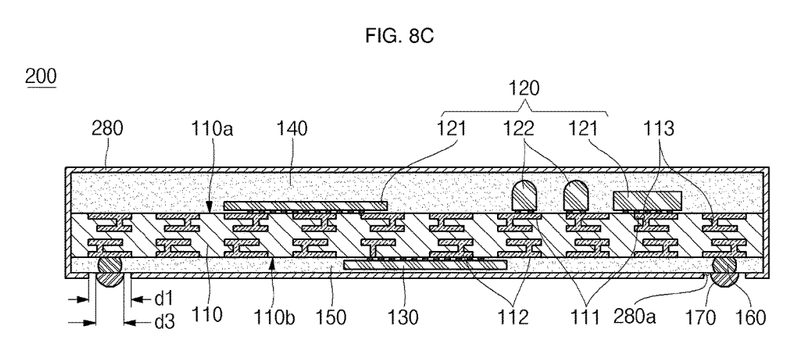

Referring to FIGS. 8A to 8C, cross-sectional views illustrating the steps of forming an EMI shielding layer (S23), forming exposing holes (S24) and forming second conductive bumps (S25) of FIG. 7 are illustrated. Therefore, the method for manufacturing the semiconductor package 200 (S20) will be described with reference to FIGS. 7 and 8A to 8C.

As illustrated in FIG. 8A, in the forming of the EMI shielding layer (S23), the EMI shielding layer 280 is formed to entirely cover the substrate 110, the first molding 140 and the second molding 150. The EMI shielding layer 280 may be formed to a predetermined thickness by plasma deposition or spraying, but aspects of the present disclosure are not limited thereto.

As illustrated in FIG. 8B, in the forming of the exposing holes (S24), the EMI shielding layer 280 may be partially removed to expose the first conductive bumps 160 to the outside. That is to say, the first conductive bumps 160 are exposed to the outside by forming a plurality of exposing holes 280a in the EMI shielding layer 280. The plurality of exposing holes 280a of the EMI shielding layer 280 are formed by removing a portion of the EMI shielding layer 280 by etching or laser. In addition, the forming of the exposing holes 280a may be performed by any process known in the art so long as an EMI shielding material can be patterned in a desired pattern, but not limited to etching or laser as disclosed herein. As illustrated in FIG. 8B, a width (d1) of each of the exposing holes 280a is preferably larger than a diameter (d2) of each of the first conductive bumps 160. In order to electrically disconnect the first conductive bumps 160 from second conductive bumps 170 to be described later, the exposing holes 280a are preferably formed to have a sufficient large width (i.e., d1). In addition, after the forming of the exposing holes 280a, a cleaning process for removing metal residuals may further be performed.

As illustrated in FIG. 8C, in the forming of the second conductive bumps (S25), the second conductive bumps 170 are formed to be electrically connected to the first conductive bumps 160 exposed to the outside by the exposing holes 280a. The second conductive bumps 170 are preferably formed to have a larger diameter (d3) than the width (d1) of the exposing holes 280a. That is to say, the second conductive bumps 170 may be spaced a predetermined distance apart from the EMI shielding layer 280 to be electrically disconnected from the EMI shielding layer 280

The discussion herein included numerous illustrative figures that showed various portions of an electronic package assembly and method of manufacturing thereof. For illustrative clarity, such figures did not show all aspects of each example assembly. Any of the example assemblies and/or methods provided herein may share any or all characteristics with any or all other assemblies and/or methods provided herein.

In summary, various aspects of this disclosure provide a semiconductor package and a method of manufacturing a semiconductor package. As a non-limiting example, various aspects of this disclosure provide a semiconductor package, and method of manufacturing thereof, that comprises shielding on multiple sides thereof. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A semiconductor package comprising:
a substrate having a top substrate surface, a bottom substrate surface, and a plurality of lateral substrate surfaces;
a first electronic device on the top substrate surface and electrically connected to the substrate;
a first molding that covers at least the top substrate surface and the first electronic device, the first molding having a top first molding surface, a bottom first molding surface, and a plurality of lateral first molding surfaces;
a second molding that covers at least the bottom substrate surface, the second molding having a top second molding surface, a bottom second molding surface, and a plurality of lateral second molding surfaces, wherein the second molding extends laterally at least as far as the lateral substrate surfaces;
a plurality of first conductive bumps on the bottom substrate surface, electrically connected to the substrate, and passing through the second molding; and
an electromagnetic interference (EMI) shielding layer that covers at least the top first molding surface, the lateral first molding surfaces, the lateral substrate surfaces, and the lateral second molding surfaces, wherein the EMI shielding layer is spaced apart from the first conductive bumps.

2. The semiconductor package of claim 1, wherein the entire bottom second molding surface is exposed from the EMI shielding layer.

3. The semiconductor package of claim 1, wherein:
the top second molding surface comprises an uppermost surface of the second molding;
the bottom second molding surface comprises a lower-most surface of the second molding; and
each of the plurality of first conductive bumps is positioned in a respective aperture in the second molding, where the respective aperture extends from the uppermost surface of the second molding to the lowermost surface of the second molding.

4. The semiconductor package of claim 1, wherein on a bottom side of the semiconductor package, the EMI shielding layer contacts only the bottom second molding surface.

5. The semiconductor package of claim 1, wherein the EMI shielding layer covers at least a portion of the bottom second molding surface.

6. The semiconductor package of claim 1, comprising a plurality of second conductive bumps, each of which is coupled to a respective one of the first conductive bumps, and wherein:
the EMI shielding layer covers a portion of the bottom second molding surface and exposes the plurality of second conductive bumps to the outside of the EMI shielding layer; and
the EMI shielding layer comprises a rectangular exposing hole that exposes at least one of the second conductive bumps to the outside of the EMI shielding layer.

7. The semiconductor package of claim 1, comprising a plurality of second conductive bumps, each of which is coupled to a respective one of the first conductive bumps, and wherein:
the EMI shielding layer covers a portion of the bottom second molding surface and exposes the plurality of second conductive bumps to the outside of the EMI shielding layer; and
the EMI shielding layer comprises an ablated exposing hole that exposes at least one of the second conductive bumps to the outside of the EMI shielding layer.

8. The semiconductor package of claim 1, comprising a second electronic device on the bottom substrate surface and electrically connected to the substrate, wherein each conductive bump of the plurality of first conductive bumps vertically spans at least the entire height of the second electronic device.

9. A semiconductor package comprising:
a substrate having a top substrate surface, a bottom substrate surface, and a plurality of lateral substrate surfaces;
a first molding part that covers at least the top substrate surface, the first molding part having a top first molding surface, a bottom first molding surface, and a plurality of lateral first molding surfaces;
a second molding part that covers at least the bottom substrate surface, the second molding part having a top second molding surface, a bottom second molding surface, and a plurality of lateral second molding surfaces, wherein the bottom second molding surface comprises a lower-most surface of the second molding part;
a plurality of first conductive bumps on the bottom substrate surface and electrically connected to the substrate, wherein each of the first conductive bumps passes through a respective aperture in the second molding part that extends from the top second molding surface to the lower-most surface of the second molding part; and
an electromagnetic interference (EMI) shielding layer that covers at least a portion of each of the top first molding surface, the lateral first molding surfaces, the lateral substrate surfaces, and the lateral second molding surfaces, wherein the EMI shielding layer is spaced apart from the first conductive bumps.

10. The semiconductor package of claim 9, wherein each of the plurality of lateral first molding surfaces is coplanar with a respective one of the plurality of lateral substrate surfaces and with a respective one of the plurality of lateral second molding surfaces.

11. The semiconductor package of claim 9, wherein the EMI shielding layer covers at least a portion of the bottom second molding surface.

12. The semiconductor package of claim 9, wherein the bottom second molding surface is ground and the top first molding surface is not ground.

13. The semiconductor package of claim 9, comprising a bottom electronic device on the bottom substrate surface and electrically connected to the substrate, wherein each conductive bump of the plurality of first conductive bumps vertically spans at least the entire height of the bottom electronic device.

14. The semiconductor package of claim 9, wherein each conductive bump of the plurality of first conductive bumps comprises a planar surface that is coplanar with the lower-most surface of the second molding part.

15. The semiconductor package of claim 9, wherein the EMI shielding layer comprises an ablated hole that exposes at least one of the first conductive bumps through the EMI shielding layer.

16. The semiconductor package of claim 9, wherein the EMI shielding layer comprises a rectangular hole that exposes at least one of the first conductive bumps through the EMI shielding layer.

17. A semiconductor package comprising:
a substrate having a top substrate surface, a bottom substrate surface, and a plurality of lateral substrate surfaces;

an upper die coupled to the top substrate surface;
a first dielectric layer that covers at least the top substrate surface and at least a portion of the upper die, the first dielectric layer having a top first dielectric layer surface, a bottom first dielectric layer surface, and a plurality of lateral first dielectric layer surfaces, and wherein each of the plurality of lateral first dielectric layer surfaces is coplanar with a respective one of the plurality of lateral substrate surfaces;
a lower die coupled to the bottom substrate surface;
a second dielectric layer that covers at least a portion of the bottom substrate surface and at least a portion of the lower die, the second dielectric layer having a top second dielectric layer surface, a bottom second dielectric layer surface, and a plurality of lateral second dielectric layer surfaces;
a plurality of conductive bumps on the bottom substrate surface and electrically connected to the substrate, wherein each conductive bump of the plurality of conductive bumps extends vertically along at least the entire height of the lower die; and
an electromagnetic interference (EMI) shielding layer that covers at least a portion of each of the top first molding surface and the lateral first molding surfaces.

18. The semiconductor package of claim 17, wherein the first conductive bumps extend lower from the substrate than the lower die.

19. The semiconductor package of claim 17, wherein the entire bottom of the semiconductor package is exposed from the EMI shielding layer.

20. The semiconductor package of claim 17, wherein the EMI shielding layer covers the lateral sides of the substrate.

\* \* \* \* \*